United States Patent [19]

Shiralagi

[11] Patent Number: 5,730,798
[45] Date of Patent: Mar. 24, 1998

[54] MASKING METHODS DURING SEMICONDUCTOR DEVICE FABRICATION

[75] Inventor: Kumar Shiralagi, Chandler, Ariz.

[73] Assignee: Motorola, Schaumburg, Ill.

[21] Appl. No.: 511,772

[22] Filed: Aug. 7, 1995

[51] Int. Cl.[6] .................................................. C30B 23/04
[52] U.S. Cl. .............................. 117/97; 117/95; 438/689
[58] Field of Search ............................ 117/2, 95, 97; 437/228 M, 228 SE, 228 SD, 228 CR; 438/689

[56] References Cited

U.S. PATENT DOCUMENTS 3,895,155  7/1975  Shukuri et al. .......................... 428/206
4,717,681  1/1988  Curran ..................................... 437/31

*Primary Examiner*—Felisa Garrett
*Attorney, Agent, or Firm*—Eugene A. Parsons

[57] ABSTRACT

A method of masking semiconductor substrates during fabrication of semiconductor devices includes positioning an oxide mask on the substrate so as to define a growth area and an unmasked portion the surface. A dense oxide layer is grown on the unmasked portion and the oxide mask is removed to expose the growth area. The substrate is introduced into a growth chamber and heated to approximately 580°–600° C. to desorb any native oxide in the exposed growth area. Crystalline material is selectively grown on the exposed growth area and the substrate is heated to approximately 640° C. under high arsenic flux to desorb the dense oxide layer, without removing the substrate from the chamber.

10 Claims, 1 Drawing Sheet

MASKING METHODS DURING SEMICONDUCTOR DEVICE FABRICATION

FIELD OF THE INVENTION

The present invention pertains to the fabrication of semiconductor devices and more specifically to improved masking techniques during semiconductor device fabrication.

BACKGROUND OF THE INVENTION

In the semiconductor field it is common to sequentially grow several different layers of semiconductor material and use various masks and etching steps to form the desired devices and terminals on the devices. In some methods, masking material, e.g. photoresist or the like, is applied and semiconductor material is grown over masked and unmasked areas. The material on the masked areas is then removed by etching and lift-off. In some instances material is selectively grown in unmasked areas and the masking material is then removed. One problem that arises is that the structure or substrate (generally a wafer) must be removed from the growth chamber to remove the masking material. The structure is then masked again and reintroduced into the growth chamber for re-growth.

Generally, in these prior art methods of fabricating semiconductor devices, etching is required to remove unwanted material and masks are removed by etching, solvent, or the like. During the etching and/or mask removal processes, the material of the semiconductor device has a high likelihood of being contaminated by the etchant, which contamination greatly reduces the life of the device, the operating characteristics of the device, and the reliability of the device. Further, the etching process severely damages semiconductor material adjacent the etched areas which further reduces life, operating characteristics, and reliability. Also, etching processes are very time consuming and difficult to perform.

In addition to the etching problems, all known prior art fabrication processes require many interspersed growing, masking and etching steps which greatly complicate and lengthen the process. For example, when epitaxial layers are grown, the wafers must be placed in a vacuum or pressure chamber to provide the atmosphere for the growth. Each time the wafer must be etched and/or masked, it must be removed from the chamber, resulting in large amounts of preparation time for each step. Also, each time wafers are removed from a chamber and subsequently replaced, the opening and preparation of the chamber (as well as the processing of the wafer) is an opportunity for additional impurities and contaminants to be introduced to the wafer.

Accordingly, it would be highly desirable to provide fabrication methods for semiconductor devices with improved masking processes.

It is a purpose of the present invention to provide a new and improved method of masking substrates during semiconductor device fabrication.

It is another purpose of the present invention to provide a new and improved method of masking substrates during the fabrication of semiconductor devices which does not require removal of the substrate from the processing chamber to remove the mask.

It is still another purpose of the present invention to provide a new and improved method of masking substrates during the fabrication of semiconductor devices which does not require the introduction and removal of wafers or substrates from processing chambers several times in sequence.

It is a further purpose of the present invention to provide a new and improved method of masking substrates during the fabrication of semiconductor devices which is much simpler and includes less chance of contamination of the devices.

SUMMARY OF THE INVENTION

The above problems and others are at least partially solved and the above purposes and others are realized in a method of masking substrates during fabrication of semiconductor devices including positioning an oxide mask on a substrate so as to define a growth area beneath the mask and an unmasked portion on the surface of the substrate. A dense oxide layer is then grown on the unmasked portion of the surface, the dense oxide layer being thicker and denser than any native oxide present, and the oxide mask is removed to expose the growth area.

The substrate is then introduced into a growth chamber and heated to desorb any native oxide in the exposed growth area. Because the native oxide is thinner than the dense oxide layer, the native oxide can be desorbed while retaining the dense oxide layer as a mask. A crystalline material is selectively grown on the exposed growth area and the substrate is heated under high group V flux to desorb the dense oxide layer in the growth chamber. Thus, semiconductor devices are grown and the mask is removed without taking the substrate from the growth chamber.

BRIEF DESCRIPTION OF THE DRAWINGS

Referring to the drawings.

DESCRIPTION OF THE PREFERRED EMBODIMENTS

Figure 1:
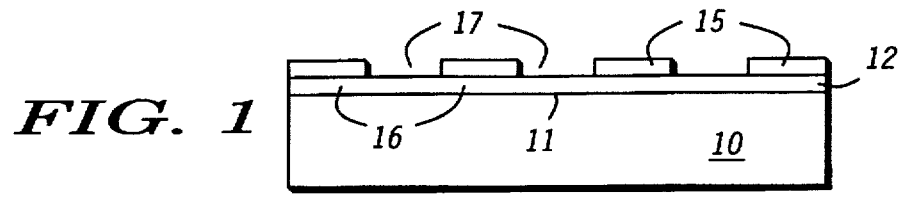
FIGS. 1–4 are simplified sectional views of a substrate illustrating several sequential steps in a masking process in accordance with the present invention.
Figure 2:
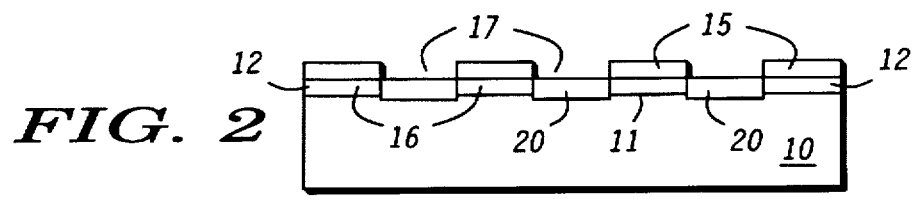

Turning now to the drawings, FIGS. 1–4 illustrate several steps in a method of masking a substrate 10, in accordance with the present invention, for the fabrication of semiconductor devices. Referring specifically to FIG. 1, a simplified sectional view of substrate 10 having a planar surface 11 is illustrated. In this specific embodiment, substrate 10 is formed of gallium arsenide (GaAs), but it will be understood by those skilled in the art that other materials known in the art might be utilized. Generally, a thin layer 12 of native oxide is present on surface 11 of substrate 10 if the substrate has been exposed to air. The layer 12 of oxide is approximately 20 angstroms thick and forms on substrate 10 whenever it is exposed to air (ambient) for a short time.

Surface 11 of substrate 10 is patterned or otherwise covered with an oxide mask 15 by any convenient method. Oxide mask 15 may be simply a shadow or metal mask or it can be formed in the well known manner with photolithography. In any case, oxide mask 15 is positioned on surface 11, or on layer 12 of native oxide if it is present, so as to define one or more growth areas 16 on surface 11 beneath oxide mask 15 and one or more unmasked portions 17 on surface 11 of substrate 10. In some special applications it may be possible to prevent the growth of layer 12 of native oxide on surface 11, in which case the following process is performed directly on surface 11. For purposes of this explanation, however, it is assumed that layer 12 of native oxide is present.

A second oxide layer 20 is grown on unmasked portions 17 of the native oxide (see FIG. 2) and, as will be understood by those skilled in the art, will form with the native oxide as a portion thereof. In a preferred method of forming second oxide layer 20, substrate 10 is exposed to an ultraviolet source in ambient conditions (air), i.e. no special chamber, etc., to expose the unmasked portions 17 of substrate 10 to a combination of ultraviolet rays and ozone. The UV-ozone process grows a much thicker and denser layer of oxide than the native oxide. While other methods of growing second oxide layer 20 may be devised and used, it should be understood that second oxide layer 20 is formed sufficiently thicker and denser than the native oxide so that selective removal of the native oxide can be accomplished, as will be explained presently.

Figure 3:
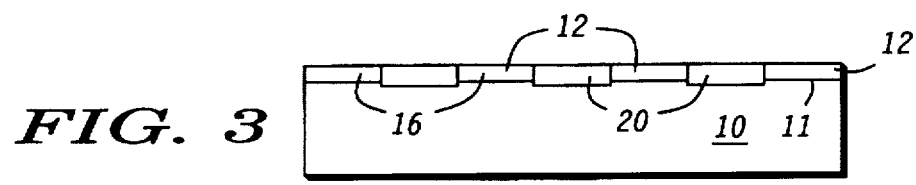
Figure 4:
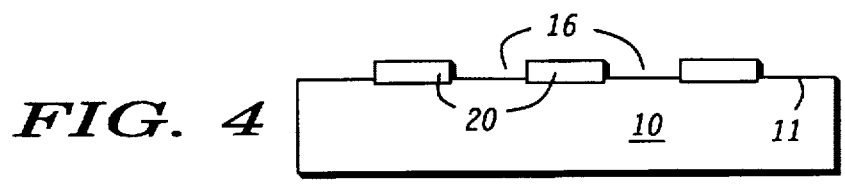

Once oxide layer 20 is grown, oxide mask 15 is removed to expose growth areas 16, as illustrated in FIG. 3. Substrate 10 is then introduced into a growth chamber (not shown) and heated to desorb any native oxide that may be present in growth areas 16. In the present example in which a gallium arsenide substrate is utilized, the substrate is heated in the growth chamber to approximately 580° C.–600° C. to desorb the native oxide in the exposed growth area. Substrate 10 with oxide-free growth areas 16 is illustrated in FIG. 4.

Figure 5:
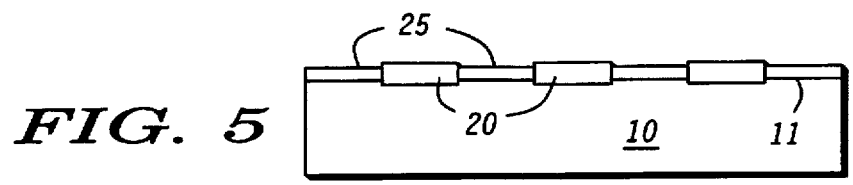
FIG. 5 is a simplified sectional view of the substrate of FIG. 4 with semiconductor material grown on the surface.

While retaining substrate 10 in the growth chamber, selective growth of crystalline, or semiconductor, material 25 in growth areas 16 is performed, as illustrated in FIG. 5. Material 25 can be lattice matched with the material of substrate 10, for instance, gallium arsenide is selectively grown at 570° C.–590° C. and lattice matched to the gallium arsenide of substrate 10, indium arsenide is selectively grown at 500° C.–515° C., etc. With oxide layer 20 in place as a mask for further growth, a predetermined amount of crystalline material 25 is selectively grown in area (or areas) 16. For purposes of this disclosure, "selective growth" or "selectively grown" is defined as growing only in the specific or designated area. Thus, in this example, material 25 grows only in growth areas 16. Further, material 25 generally grows in a crystalline form so that growth rates and shapes are crystallographic dependent, i.e. the rate and shape of growth are dependent upon the type of material 25 being utilized.

Figure 6:
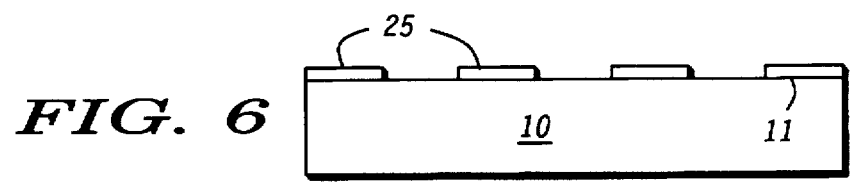
FIG. 6 is a simplified sectional view of the substrate with the mask removed.

Once the desired amount of material 25 is grown in growth areas 16, substrate 10 is heated to a higher temperature under high group V flux in the growth chamber to desorb oxide layer 20. In the present example in which the substrate is gallium arsenide, substrate 10 is heated to approximately 640° C. under high arsenic flux. The higher arsenic flux prevents gallium arsenide desorption during the desorption of oxide layer 20, resulting in the structure illustrated in FIG. 6. Thus, the mask utilized for patterned growth of material 25 is desorbed, or removed, in situ, i.e. without the need to remove substrate 10 from the growth chamber.

Figure 7:
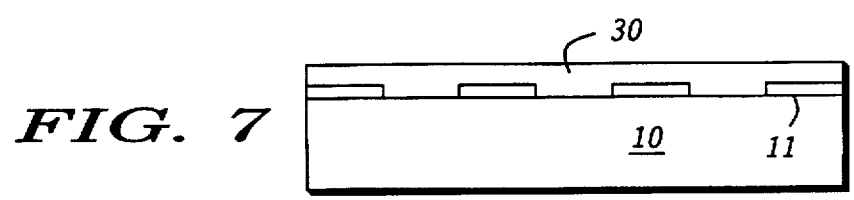
FIG. 7 is a simplified sectional view of the substrate illustrating additional material deposited thereon.

Further growth of material can be performed on crystalline material 25 subsequent to the step of heating substrate 10 to desorb oxide layer 20. As illustrated in FIG. 7, a layer 30 of additional material is grown or deposited on the surface of material 25 and on the exposed surface of substrate 10. Thus, re-growth is performed without having to remove substrate 10 from the growth chamber. It will be apparent to those skilled in the art, after reading this disclosure, that complete semiconductor devices can be formed on substrate 10 without removing it from the growth chamber.

Thus, an improved masking process is disclosed which provides a new and improved method of masking substrates during semiconductor device fabrication. The new and improved method of masking substrates does not require removal of the substrate from the processing chamber to remove the mask. Because the new and improved method of masking substrates does not require the introduction and removal of wafers or substrates from processing chambers several times in sequence during the fabrication of semiconductor devices, the fabrication process is much simpler and includes less chance of contamination of the devices. The present novel process allows selective growth and further re-growth, all in-situ, without exposure to air and contamination during the intermediate processing steps between epitaxy, etc. By eliminating air and other contaminant exposure between steps, the novel process ensures good quality in subsequent epitaxial steps.

While I have shown and described specific embodiments of the present invention, further modifications and improvements will occur to those skilled in the art. I desire it to be understood, therefore, that this invention is not limited to the particular forms shown and I intend in the appended claims to cover all modifications that do not depart from the spirit and scope of this invention.

What is claimed is:

1. A method of masking substrates during fabrication of semiconductor devices comprising the steps of:
   providing a substrate with a planar surface;
   positioning a mask on the surface so as to define a growth area and an unmasked portion on the surface of the substrate;
   growing an oxide layer on the unmasked portion of the surface;
   removing the mask to expose the growth area;
   introducing the substrate into a growth chamber and selectively grow, on the exposed growth area, a crystalline material; and
   heating the substrate in the growth chamber to desorb the oxide layer.

2. A method of masking substrates during fabrication of semiconductor devices as claimed in claim 1 wherein the step of heating the substrate in the growth chamber to desorb the oxide layer includes heating the substrate to approximately 640° C. under high arsenic flux.

3. A method of masking substrates during fabrication of semiconductor devices as claimed in claim 1 wherein the step of growing an oxide layer includes exposing the substrate to an ultraviolet source in air to expose the surface to a combination of ultraviolet rays and ozone.

4. A method of masking substrates during fabrication of semiconductor devices as claimed in claim 1 wherein the step of providing the substrate includes providing a substrate of gallium arsenide with a thin layer of native oxide on the surface.

5. A method of masking substrates during fabrication of semiconductor devices as claimed in claim 4 wherein the step of introducing the substrate into the growth chamber includes heating the substrate to desorb native oxide in the exposed growth area.

6. A method of masking substrates during fabrication of semiconductor devices as claimed in claim 5 wherein the step of heating the substrate to desorb native oxide in the exposed growth area includes heating the gallium arsenide substrate in the growth chamber to approximately 580° C.–600° C.

7. A method of masking substrates during fabrication of semiconductor devices as claimed in claim 1 wherein the steps of providing a substrate with a planar surface, positioning a mask on the surface, and growing an oxide layer on the unmasked portion of the surface are performed at room temperature.

8. A method of masking substrates during fabrication of semiconductor devices comprising the steps of:

provi ding a substrate with a planar surface and a layer of native oxide on the surface of the substrate;

positioning a mask on the layer of native oxide so as to define a growth area in the layer of native oxide beneath the mask and an unmasked portion of native oxide on the surface of the substrate;

growing a second oxide layer on the unmasked portion of native oxide, the second oxide layer being thicker and denser than the native oxide layer;

removing the mask to expose the growth area;

introducing the substrate into a growth chamber and heating the substrate to desorb the native oxide in the exposed growth area; and selectively growing, on the exposed growth area, a crystalline material.

9. A method of masking substrates during fabrication of semiconductor devices comprising the steps of:

providing a gallium arsenide substrate with a planar surface and a layer of native oxide on the surface of the substrate;

positioning a mask on the layer of native oxide so as to define a growth area in the layer of native oxide beneath the mask and an unmasked portion of native oxide on the surface of the substrate;

growing a second oxide layer on the unmasked portion of native oxide by exposing the substrate to an ultraviolet source in air to expose the surface to a combination of ultraviolet rays and ozone, the second oxide layer being thicker and denser than the native oxide layer;

removing the mask to expose the growth area;

introducing the substrate into a growth chamber and heating the gallium arsenide substrate in the growth chamber to approximately 580° C. to desorb the native oxide in the exposed growth area;

selectively growing, on the exposed growth area, a crystalline material; and heating the substrate in the growth chamber to approximately 640° C. under a high arsenic flux to desorb the second oxide layer.

10. A method of masking substrates during fabrication of semiconductor devices as claimed in claim 9 including in addition a step of growing additional material at least on the crystalline material subsequent to the step of heating the substrate in the growth chamber to approximately 640° C. under high arsenic flux to desorb the second oxide layer and without removing the substrate from the growth chamber.

\* \* \* \* \*